US009040897B2

(12) United States Patent
Huang

(10) Patent No.: US 9,040,897 B2
(45) Date of Patent: May 26, 2015

(54) PHOTO-SENSING PIXEL CIRCUIT WITH CONVERSION GAIN ADJUSTMENT UNIT AND IMAGE SENSOR

(75) Inventor: Dong-Hai Huang, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 332 days.

(21) Appl. No.: 13/442,870

(22) Filed: Apr. 10, 2012

(65) Prior Publication Data

US 2013/0206960 A1    Aug. 15, 2013

(30) Foreign Application Priority Data

Feb. 10, 2012    (TW) .............................. 101104399 A

(51) Int. Cl.
*H01L 27/146*    (2006.01)
*G01J 1/44*    (2006.01)
*H01J 27/14*    (2006.01)

(52) U.S. Cl.
CPC .............. *H01L 27/14609* (2013.01); *G01J 1/44* (2013.01); *G01J 2001/4406* (2013.01); *H01J 27/146* (2013.01); *H01L 27/14643* (2013.01)

(58) Field of Classification Search
CPC .............. H03G 3/3084; H04B 10/6931; H04B 10/6911; G01J 1/44; G01J 2001/4406; G01J 2001/444; H04N 3/155; H04N 5/335; H04N 5/355; H04N 5/3559; H01J 40/14; H03F 3/08; H03F 3/087

USPC ............................ 250/214 AG, 208.1, 214 R; 257/290–292, 440; 348/292–311
See application file for complete search history.

(56) References Cited

U.S. PATENT DOCUMENTS

2010/0128156 A1 *    5/2010    Tanaka et al. ................. 348/308
2010/0248412 A1 *    9/2010    Guidash ......................... 438/65

* cited by examiner

*Primary Examiner* — Georgia Y Epps
*Assistant Examiner* — Carolynn A Moore
(74) *Attorney, Agent, or Firm* — Jianq Chyun IP Office

(57) ABSTRACT

A photo-sensing pixel circuit including a photo-sensing part, a transfer transistor, a plurality of adjustment transistors, and an output circuit is provided. The photo-sensing part senses a light source and generates a corresponding number of electrons. The transfer transistor coupled to the photo-sensing part has a floating node and converts the electrons generated by the photo-sensing part into a voltage signal. The adjustment transistors have a first end and a second end, wherein the first end is coupled to a power supply, and the second end is coupled to the transfer transistor via the floating node. The output circuit coupled to the transfer transistor outputs a sensing signal according to the voltage signal, wherein the sensing signal is corresponding to the brightness of the light source. The adjustment transistors operate in at least two operation modes. Different numbers of the adjustment transistors are turned on in different operation modes.

16 Claims, 11 Drawing Sheets

PHOTO-SENSING PIXEL CIRCUIT WITH CONVERSION GAIN ADJUSTMENT UNIT AND IMAGE SENSOR

CROSS-REFERENCE TO RELATED APPLICATION

This application claims the priority benefit of Taiwan application serial no. 101104399, filed on Feb. 10, 2012. The entirety of the above-mentioned patent application is hereby incorporated by reference herein and made a part of this specification.

BACKGROUND OF THE DISCLOSURE

1. Field of the Disclosure

The disclosure generally relates to a sensing circuit, and more particularly, to a photo-sensing pixel circuit and an image sensor.

2. Description of Related Art

A complementary metal-oxide-semiconductor (CMOS) image sensor is usually fabricated on a Si, GaAs, SiC, or SiGe substrate. For the purpose of image sensing, a CMOS image sensor usually includes a photo-sensing part, a signal conversion circuit, and an output circuit. The photo-sensing part senses a light source and transmits an obtained optical signal to a transmission circuit. The signal conversion circuit then converts the optical signal into an electric signal and transmits the electric signal to the output circuit.

In the operation mode described above, the conversion gain of the CMOS image sensor is determined by the equivalent capacitance on an internal node of the signal conversion circuit. If the photo-sensing part has a high full well capacity (FWC) and the CMOS image sensor has a large conversion gain, after electrons generated by the photo-sensing part are converted by the signal conversion circuit into the electric signal, the voltage obtained when the electric signal is input into the output circuit may be too low, and as a result, the entire CMOS image sensor cannot work. Or, the low voltage produced by the electric signal may cause the electrons generated by the photo-sensing part not to be successfully transmitted to the signal conversion circuit, and as a result, image lag may be produced.

The FWC of the photo-sensing part is usually reduced to resolve aforementioned problem. However, since the dynamic range of the CMOS image sensor is related to the FWC and read noise, under the same read noise condition, the dynamic range of the CMOS image sensor has to be sacrificed once the FWC of the photo-sensing part is reduced in order to maintain a high signal sensitivity inside the signal conversion circuit. In other words, even though a conventional CMOS image sensor with a high conversion gain offers a high sensitivity, the operation of a backend circuit will be restricted when the signal range of the CMOS image sensor is too large. In this case, it is impossible to achieve a large dynamic range and image lag may be produced.

A CMOS image sensor with a smaller conversion gain is designed as another resolution. Even though such a design allows the photo-sensing part to have a high FWC and a large dynamic range to be achieved, it offers a low signal sensitivity inside the signal conversion circuit. If the CMOS image sensor works in a poorly illuminated environment, a high conversion gain is required, which may result in extra noise in the backend circuit and accordingly a reduced signal-to-noise ratio (SNR). In other words, even though a conventional CMOS image sensor with a low conversion gain offers a high dynamic range, a large backend gain is required when it works in a poorly illuminated environment. As a result, the SNR of the circuit will be reduced.

SUMMARY OF THE DISCLOSURE

Accordingly, the disclosure is directed to a photo-sensing pixel circuit. An image sensor adopting the photo-sensing pixel circuit can offer both a high sensitivity and a large dynamic range.

In one aspect, the disclosure provides a photo-sensing pixel circuit including a photo-sensing part, a signal conversion unit, a conversion gain adjustment unit, and an output circuit. The photo-sensing part senses a light source and generates a corresponding number of electrons. The signal conversion unit is coupled to the photo-sensing part and has a floating node. The signal conversion unit converts the electrons into a voltage signal according to a conversion gain. The conversion gain adjustment unit is coupled to the signal conversion unit via the floating node. The conversion gain adjustment unit adjusts the conversion gain. The output circuit is coupled to the signal conversion unit. The output circuit outputs a sensing signal according to the voltage signal, wherein the sensing signal is corresponding to the brightness of the light source. The conversion gain adjustment unit operates in at least two operation modes, wherein the conversion gain in one of the operation modes is greater than that in the other operation mode.

According to an embodiment of the disclosure, the conversion gain adjustment unit has a first end and a second end. The first end is coupled to a first power supply, and the second end is coupled to the floating node.

According to an embodiment of the disclosure, the conversion gain adjustment unit includes a plurality of adjustment transistors. The adjustment transistors are coupled between the first end and the second end. In different operation modes, different numbers of the adjustment transistors are turned on. The conversion gain of the signal conversion unit is adjusted according to the number of the adjustment transistors that are turned on.

According to an embodiment of the disclosure, the more adjustment transistors are turned on, the lower the conversion gain of the signal conversion unit is.

According to an embodiment of the disclosure, when all the adjustment transistors are turned on, the first power supply resets the floating node.

According to an embodiment of the disclosure, the adjustment transistors are coupled between the first end and the second end in series.

According to an embodiment of the disclosure, the photo-sensing pixel circuit further includes a control unit coupled to the output circuit. The control unit adjusts the number of the adjustment transistors that are turned on according to the brightness of the light source corresponding to the sensing signal.

According to an embodiment of the disclosure, the signal conversion unit includes a transfer transistor and a source follower. The transfer transistor is coupled to the photo-sensing part and transmits a photocurrent signal to the floating node. The source follower is coupled to the floating node and a second power supply and amplifies the voltage signal.

According to an embodiment of the disclosure, the signal conversion unit further includes a row select transistor coupled to the source follower. The row select transistor transmits the amplified voltage signal to the output circuit.

According to an embodiment of the disclosure, the higher brightness of the light source corresponding to the sensing signal is, the lower conversion gain adjusted by the conversion gain adjustment unit is.

According to an embodiment of the disclosure, the lower brightness of the light source corresponding to the sensing signal is, the greater conversion gain adjusted by the conversion gain adjustment unit is.

According to an embodiment of the disclosure, an image sensor including a plurality of photo-sensing pixel circuits described above is further provided.

From another aspect, the disclosure also provides a photo-sensing pixel circuit including a photo-sensing part, a transfer transistor, a plurality of adjustment transistors, and an output circuit. The photo-sensing part senses a light source and generates a corresponding number of electrons. The transfer transistor is coupled to the photo-sensing part and has a floating node. The transfer transistor converts the electrons generated by the photo-sensing part into a voltage signal. The adjustment transistors have a first end and a second end. The first end is coupled to a first power supply, and the second end is coupled to the transfer transistor via the floating node. The output circuit is coupled to the transfer transistor and outputs a sensing signal according to the voltage signal, wherein the sensing signal is corresponding to the brightness of the light source. The adjustment transistors operate in at least two operation modes, and in different operation modes, different numbers of the adjustment transistors are turned on.

According to an embodiment of the disclosure, when all the adjustment transistors are turned on, the first power supply resets the floating node.

According to an embodiment of the disclosure, the adjustment transistors are coupled between the first end and the second end in series.

According to an embodiment of the disclosure, the photo-sensing pixel circuit further includes a control unit coupled to the output circuit. The control unit adjusts the number of the adjustment transistors that are turned on according to the brightness of the light source corresponding to the sensing signal.

According to an embodiment of the disclosure, the photo-sensing pixel circuit further includes a source follower. The source follower is coupled to the floating node, a second power supply, and the output circuit and amplifies the voltage signal. The output circuit is coupled to the transfer transistor via the source follower.

According to an embodiment of the disclosure, the photo-sensing pixel circuit further includes a row select transistor. The row select transistor is coupled to the source follower and the output circuit and transmits the amplified voltage signal to the output circuit. The output circuit is coupled to the transfer transistor via the source follower and the row select transistor.

According to an embodiment of the disclosure, the higher brightness of the light source corresponding to the sensing signal is, the more adjustment transistors are turned on.

According to an embodiment of the disclosure, the lower brightness of the light source corresponding to the sensing signal is, the fewer adjustment transistors are turned on.

According to an embodiment of the disclosure, an image sensor including a plurality of photo-sensing pixel circuits described above is further provided.

Thereby, in an exemplary embodiment of the disclosure, the conversion gain adjustment unit of the photo-sensing pixel circuit can adjust the conversion gain so that an image sensor adopting the photo-sensing pixel circuit can offer both a high sensitivity and a large dynamic range.

These and other exemplary embodiments, features, aspects, and advantages of the disclosure will be described and become more apparent from the detailed description of exemplary embodiments when read in conjunction with accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
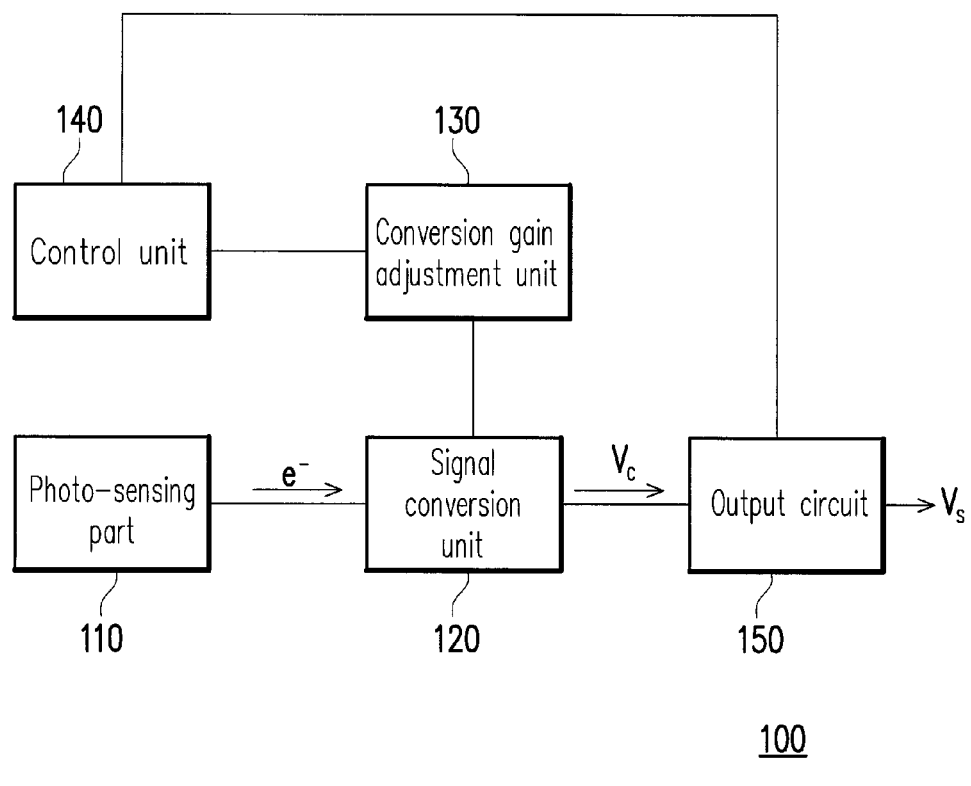
FIG. 1 is a block diagram of a photo-sensing pixel circuit according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

In an exemplary embodiment of the disclosure, a photo-sensing pixel circuit of an image sensor can adjust a conversion gain according to the brightness of a light source. For example, when the photo-sensing pixel circuit detects high brightness of the light source, the photo-sensing pixel circuit operates in a low-conversion-gain mode to increase the dynamic range, and when the photo-sensing pixel circuit detects low brightness of the light source, the photo-sensing pixel circuit operates in a high-conversion-gain mode. Thus, the image sensor can have both a high sensitivity and a high signal-to-noise ratio (SNR). Below, exemplary embodiments of the disclosure will be described in detail with reference to accompanying drawings. In each exemplary embodiment of the disclosure, the image sensor is described as a complementary metal-oxide-semiconductor (CMOS) image sensor. However, the disclosure is not limited thereto. In addition, connection terms, such as "couple" and "connect", in following description are only used for describing the accompanying drawings but are not intended to limit the connection between any two components to direct or indirect connection in actual applications.

FIG. 1 is a block diagram of a photo-sensing pixel circuit according to an embodiment of the disclosure. Referring to FIG. 1, the photo-sensing pixel circuit 100 in the present embodiment includes a photo-sensing part 110, a signal conversion unit 120, a conversion gain adjustment unit 130, a control unit 140, and an output circuit 150. The photo-sensing part 110 senses a light source (not shown), generates a corresponding number of electrons e-, and transmits the electrons to the signal conversion unit 120. The signal conversion unit 120 is coupled to the photo-sensing part 110. The signal conversion unit 120 converts the electrons e- into a voltage signal $V_C$ according to a conversion gain and transmits the voltage signal $V_C$ to the output circuit 150. The output circuit 150 is coupled to the signal conversion unit 120. The output circuit 150 outputs a sensing signal $V_S$ according to the voltage signal $V_C$, wherein the sensing signal $V_S$ is corresponding to the brightness of the light source. The conversion gain adjustment unit 130 is coupled to the signal conversion unit 120 via a floating node inside the signal conversion unit 120. The conversion gain adjustment unit 130 adjusts the conversion gain of the signal conversion unit 120. The control unit 140 is coupled to the output circuit 150. The control unit 140 adjusts the number of adjustment transistors that are turned on inside the conversion gain adjustment unit 130 according to the brightness of the light source corresponding to the sensing signal $V_S$ output by the output circuit 150. Thus, the conversion gain adjustment unit 130 has at least two operation modes, and different numbers of the adjustment transistors can be turned on in different operation modes so that the conversion gain in one of the operation modes can be greater than that in the other operation mode.

It should be mentioned that the CMOS image sensor in the present embodiment includes a plurality of photo-sensing pixel circuits 100 illustrated in FIG. 1, and the control unit 140 can be selectively disposed in each of the photo-sensing pixel circuits according to the actual design requirement. Namely, each photo-sensing pixel circuit includes a control unit 140. However, the disclosure is not limited thereto, and in other embodiments, a control unit may also be shared by multiple photo-sensing pixel circuits. Additionally, the photo-sensing part 110 is not limited to generating a corresponding number of electrons, and in some other embodiments, the photo-sensing part 110 may also generate a corresponding number of holes.

Figure 2A:
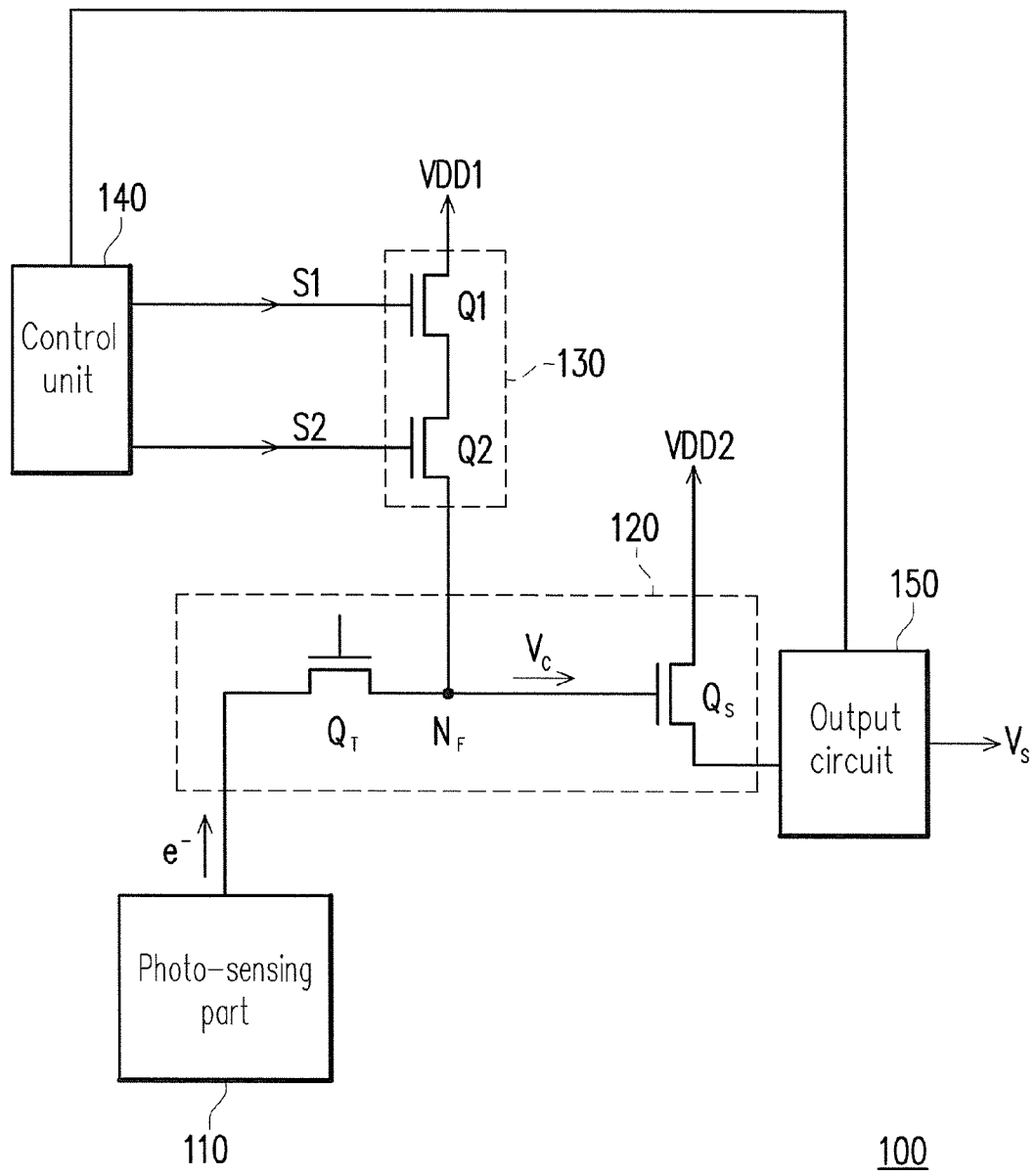
FIG. 2A is a diagram illustrating the internal circuit of each block of the photo-sensing pixel circuit in FIG. 1.

FIG. 2A is a diagram illustrating the internal circuit of each block of the photo-sensing pixel circuit in FIG. 1. Referring to FIG. 1 and FIG. 2A, in the present embodiment, the signal conversion unit 120 includes a transfer transistor $Q_T$ and a source follower $Q_S$. The transfer transistor $Q_T$ is coupled to the photo-sensing part 110 for transmitting the electrons e- generated by the photo-sensing part 110 to the floating node $N_F$. Herein the transfer transistor $Q_T$ transmits the electrons e- generated by the photo-sensing part 110 to the floating node $N_F$ through turned-on and turned-off states, and the floating node $N_F$ converts the electrons e- into a voltage signal $V_C$. When the electrons e- pass through the transfer transistor $Q_T$, the electrons e- are converted into the voltage signal $V_C$ at the floating node $N_F$. Thus, the conversion gain of the signal conversion unit 120 is determined by the equivalent capacitance C at the floating node $N_F$. Generally speaking, the conversion gain is defined as a reciprocal of the equivalent capacitance C (i.e., 1/C). Three terminals of the source follower $Q_S$ are respectively coupled to the floating node $N_F$, a power supply VDD2, and the output circuit 150, and the source follower $Q_S$ amplifies the voltage signal $V_C$. In the present embodiment, the source follower $Q_S$ is described as a transistor. However, the disclosure is not limited thereto. The gate of the source follower $Q_S$ is the input terminal of the voltage signal $V_C$. The source follower $Q_S$ is usually connected with the floating node $N_F$ through metal or poly silicon in silicon processing.

Figure 2B:
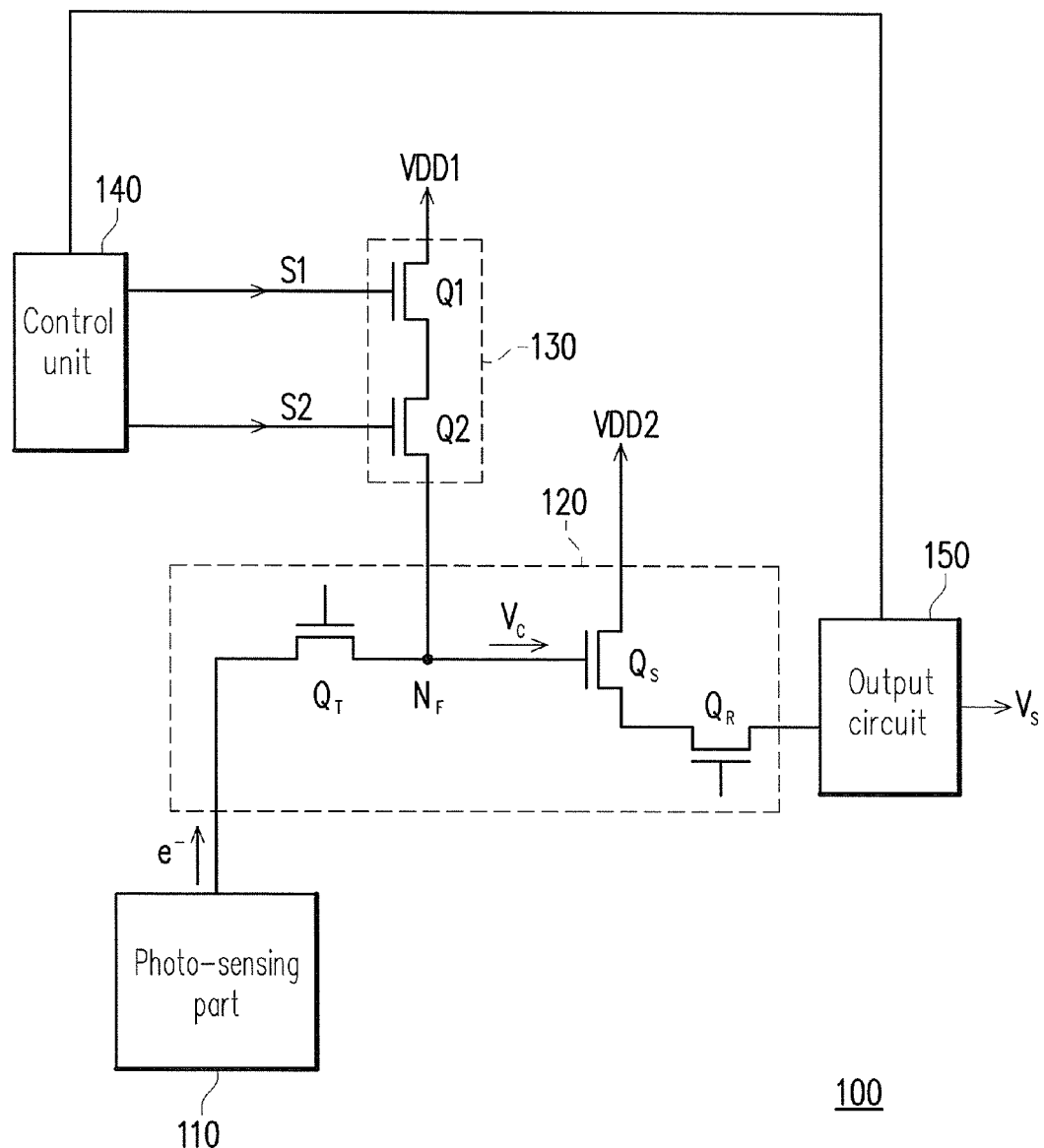
FIG. 2B is a diagram illustrating the internal circuit of each block of the photo-sensing pixel circuit in FIG. 1 according to another embodiment of the disclosure.

Thereby, the signal conversion unit 120 in the present embodiment controls the output circuit 150 to output the sensing signal $V_S$ according to the voltage signal $V_C$ through floating node voltage modulation. In other embodiments, the signal conversion unit 120 may further include a control transistor coupled to the source follower $Q_S$ for transmitting the amplified voltage signal $V_C$ to the output circuit 150. FIG. 2B is a diagram illustrating the internal circuit of each block of the photo-sensing pixel circuit in FIG. 1 according to another embodiment of the disclosure. A row select transistor $Q_R$ transmits the voltage signal $V_C$ to the output circuit 150 through turned-on and turned-off states. The output circuit 150 is coupled to the transfer transistor $Q_T$ via the source follower $Q_S$ and the row select transistor $Q_R$. The row select transistor is not a must element, and in the embodiment of FIG. 2A, the row select transistor is omitted in the signal conversion unit 120, and a floating node voltage modulation technique is adopted instead.

On the other hand, in the present embodiment, the conversion gain adjustment unit 130 has a first end and a second end. The first end is coupled to a power supply VDD1, and the second end is coupled to the floating node $N_F$. In addition, the conversion gain adjustment unit 130 includes a plurality of adjustment transistors Q1 and Q2. Herein the adjustment transistors Q1 and Q2 are coupled between the first end and the second end of the conversion gain adjustment unit 130 in series. In different operation modes, different numbers of the adjustment transistors Q1 and Q2 are turned on. Because the number of the adjustment transistors that are turned on affects the equivalent capacitance of the floating node $N_F$ and a large equivalent capacitance results in a small gain (V=Q/C), the conversion gain of the signal conversion unit 120 can be adjusted according to the number of the adjustment transistors Q1 and Q2 that are turned on.

Figure 3A:
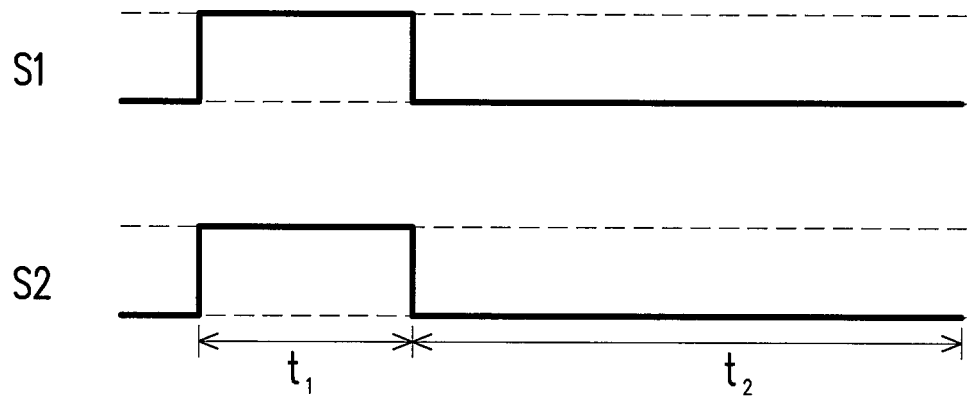
FIG. 3A illustrates waveforms of control signals S1 and S2 of adjustment transistors when the photo-sensing pixel circuit in FIG. 1 operates in a first operation mode.
Figure 3B:
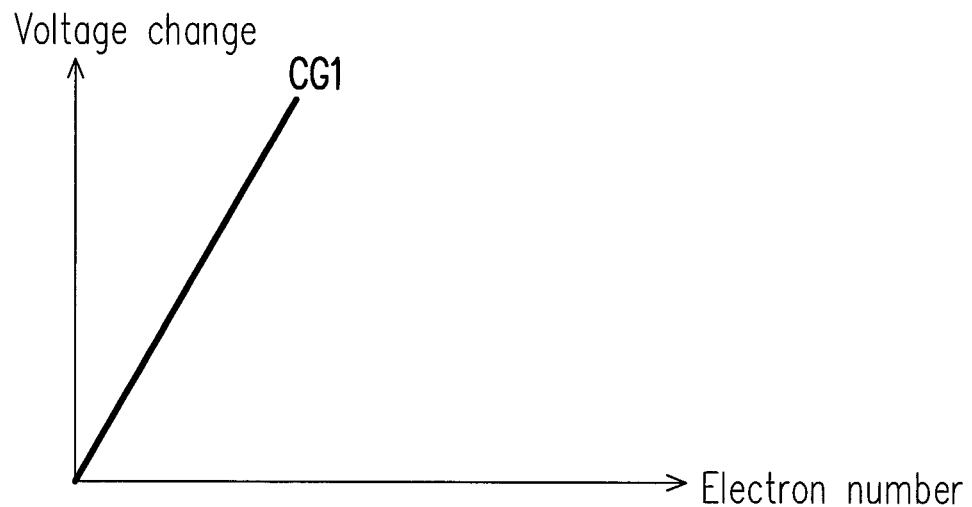
FIG. 3B illustrates a conversion gain of a signal conversion unit when the photo-sensing pixel circuit in FIG. 1 operates in the first operation mode.

FIG. 3A illustrates waveforms of control signals S1 and S2 of the adjustment transistors when the photo-sensing pixel circuit in FIG. 1 operates in the first operation mode. FIG. 3B illustrates the conversion gain of the signal conversion unit when the photo-sensing pixel circuit in FIG. 1 operates in the first operation mode. Referring to FIG. 2A, FIG. 3A, and FIG. 3B, the control unit 140 in the present embodiment respectively controls the on/off the adjustment transistors Q1 and Q2 by using control signals S1 and S2, so as to adjust the equivalent capacitance C at the floating node $N_F$.

In the present embodiment, the first operation mode refers to an operation mode in which the photo-sensing pixel circuit 100 has a high sensitivity in a poorly illuminated environment. During a period t1 in the first operation mode, the control signals S1 and S2 are both at a high level, and the adjustment transistors Q1 and Q2 are both turned on. In this case, the floating node $N_F$ is reset by the power supply VDD1. Then, during a period t2 in the first operation mode, the control signals S1 and S2 are both at a low level, and the adjustment transistors Q1 and Q2 are both turned off. In this case, the equivalent capacitance C at the floating node $N_F$ is determined by the capacitances of the transfer transistor $Q_T$, the adjustment transistor Q2, the source follower $Q_S$, and the floating node $N_F$. Such an equivalent capacitance C is corresponding to a conversion gain CG1 illustrated in FIG. 3B. In FIG. 3B, the abscissa represents the number of electrons generated by the photo-sensing part, and the ordinate represents the variation of the voltage level when the floating node $N_F$ transmits the electrons. Thus, the slope of the two axes represents the conversion gain CG1.

Figure 4A:
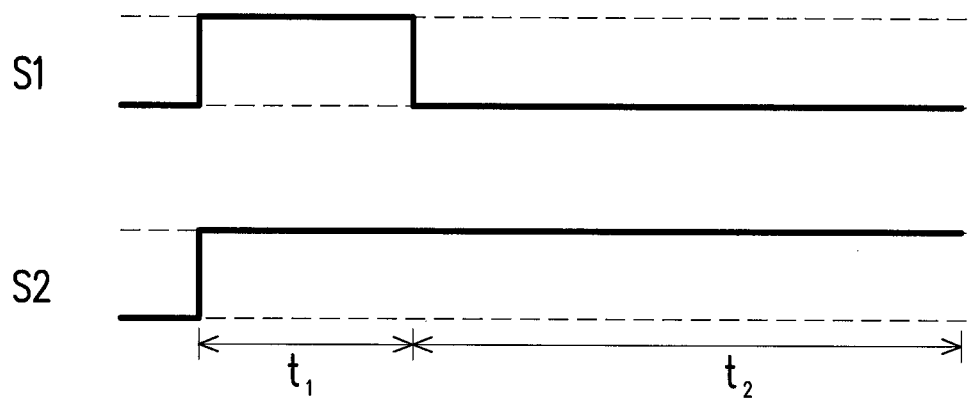
FIG. 4A illustrates waveforms of the control signals S1 and S2 of the adjustment transistors when the photo-sensing pixel circuit in FIG. 1 operates in a second operation mode.
Figure 4B:
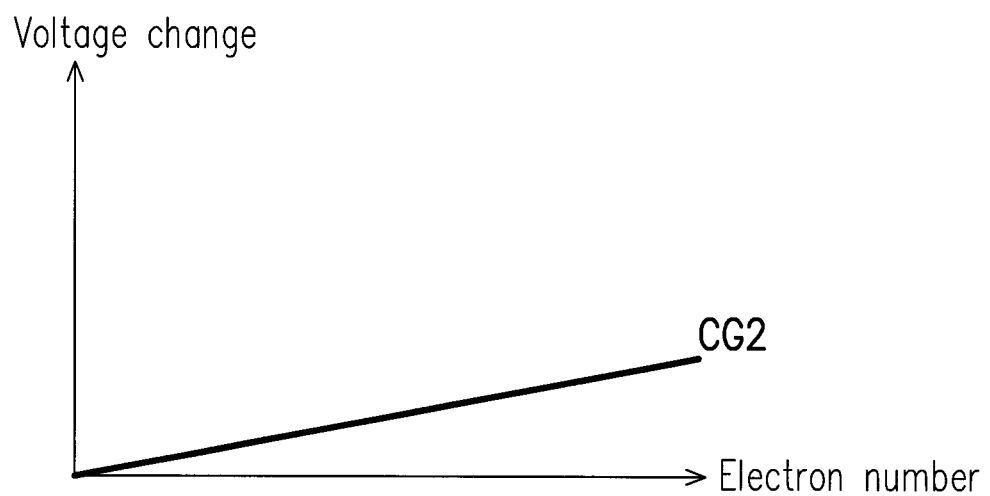
FIG. 4B illustrates the conversion gain of the signal conversion unit when the photo-sensing pixel circuit in FIG. 1 operates in the second operation mode.

FIG. 4A illustrates waveforms of the control signals S1 and S2 of the adjustment transistors when the photo-sensing pixel circuit 100 in FIG. 1 operates in a second operation mode. FIG. 4B illustrates the conversion gain of the signal conversion unit 120 when the photo-sensing pixel circuit 100 in FIG. 1 operates in the second operation mode.

Referring to FIG. 2A, FIG. 4A, and FIG. 4B, in the present embodiment, the second operation mode refers to an operation mode in which the photo-sensing pixel circuit 100 has a large dynamic range in a well illuminated environment. Similarly, during a period t1 in the second operation mode, the control signals S1 and S2 are both at a high level, and the adjustment transistors Q1 and Q2 are both turned on. In this case, the power supply VDD1 resets the floating node $N_F$. Unlike that in the first operation mode, during a period t2 of the second operation mode, the control signal S1 is at a low level while the control signal S2 is at a high level. Thus, the adjustment transistors Q1 and Q2 are respectively turned off and turned on. In this case, the equivalent capacitance C at the floating node $N_F$ is determined by the capacitances of the transfer transistor $Q_T$, the adjustment transistors Q1 and Q2, the source follower $Q_S$, and the floating node $N_F$. Such an equivalent capacitance C is corresponding to a conversion gain CG2 illustrated in FIG. 4B.

Compared to the first operation mode, the equivalent capacitance C at the floating node $N_F$ is further determined by the capacitance of the adjustment transistor Q1 in the second operation mode. Because the equivalent capacitance C increases, the conversion gain CG2 is reduced. Namely, in the present embodiment, the more the adjustment transistors Q1 and Q2 are turned on, the smaller the conversion gain of the signal conversion unit 120 is. Herein the conversion gain CG1 in the first operation mode is greater than the conversion gain CG2 in the second operation mode. In addition, the first operation mode and the second operation mode in the present embodiment are respectively adaptable to a poorly illuminated environment and a well illuminated environment. Thus, when the sensing signal $V_S$ output by the output circuit 150 is corresponding to a high brightness, the conversion gain adjusted by the conversion gain adjustment unit 130 is smaller. Contrarily, when the sensing signal $V_S$ output by the output circuit 150 is corresponding to a low brightness, the conversion gain adjusted by the conversion gain adjustment unit 130 is greater.

Figure 5A:
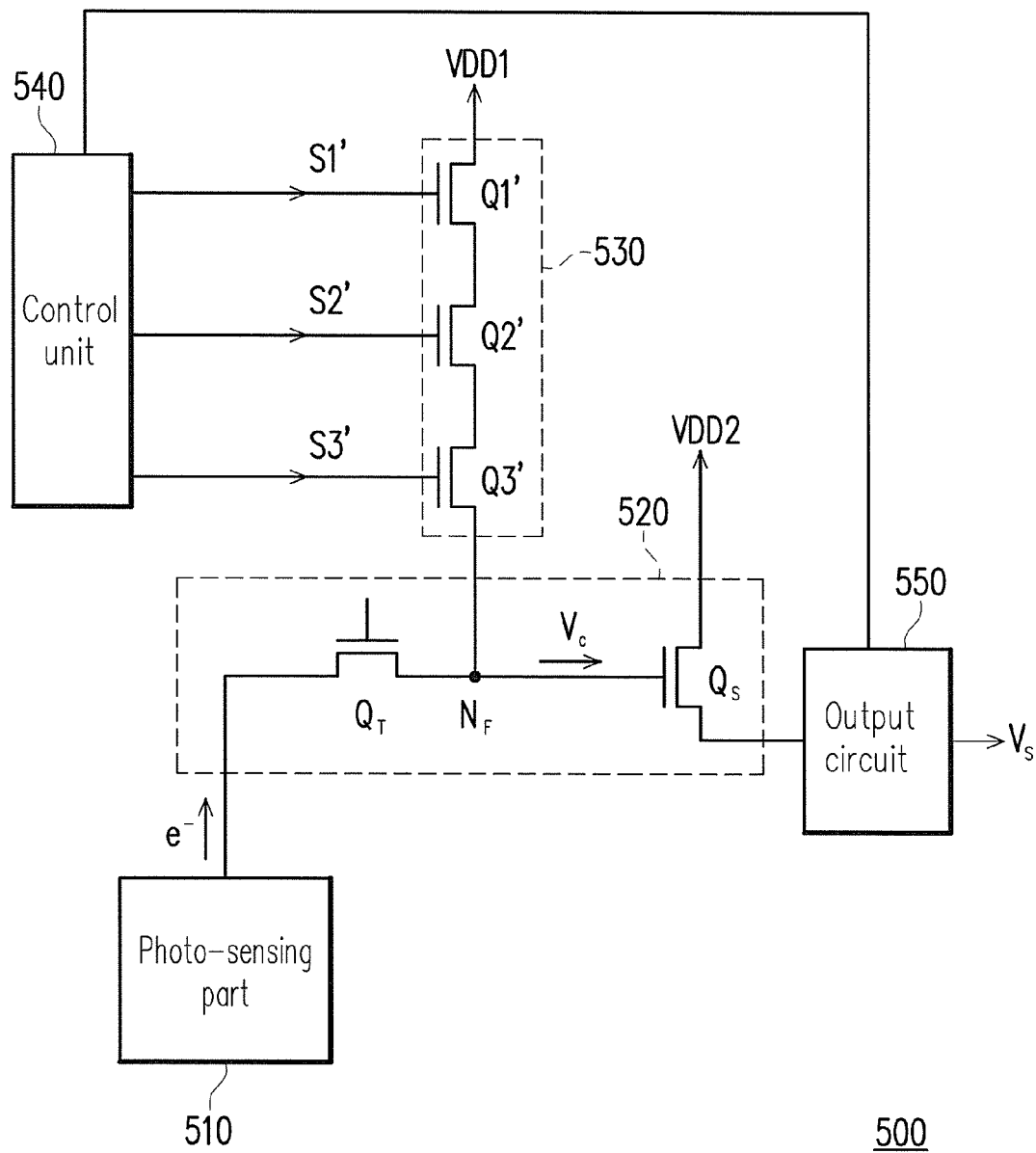
FIG. 5A is a diagram illustrating the internal circuit of each block of a photo-sensing pixel circuit according to another embodiment of the disclosure.

FIG. 5A is a diagram illustrating the internal circuit of each block of a photo-sensing pixel circuit according to another embodiment of the disclosure. Referring to FIG. 5A, the photo-sensing pixel circuit 500 in the present embodiment is similar to the photo-sensing pixel circuit 100 in FIG. 2A, and the major difference between the two photo-sensing pixel circuits lies in the number of adjustment transistors in the conversion gain adjustment unit.

Figure 5B:
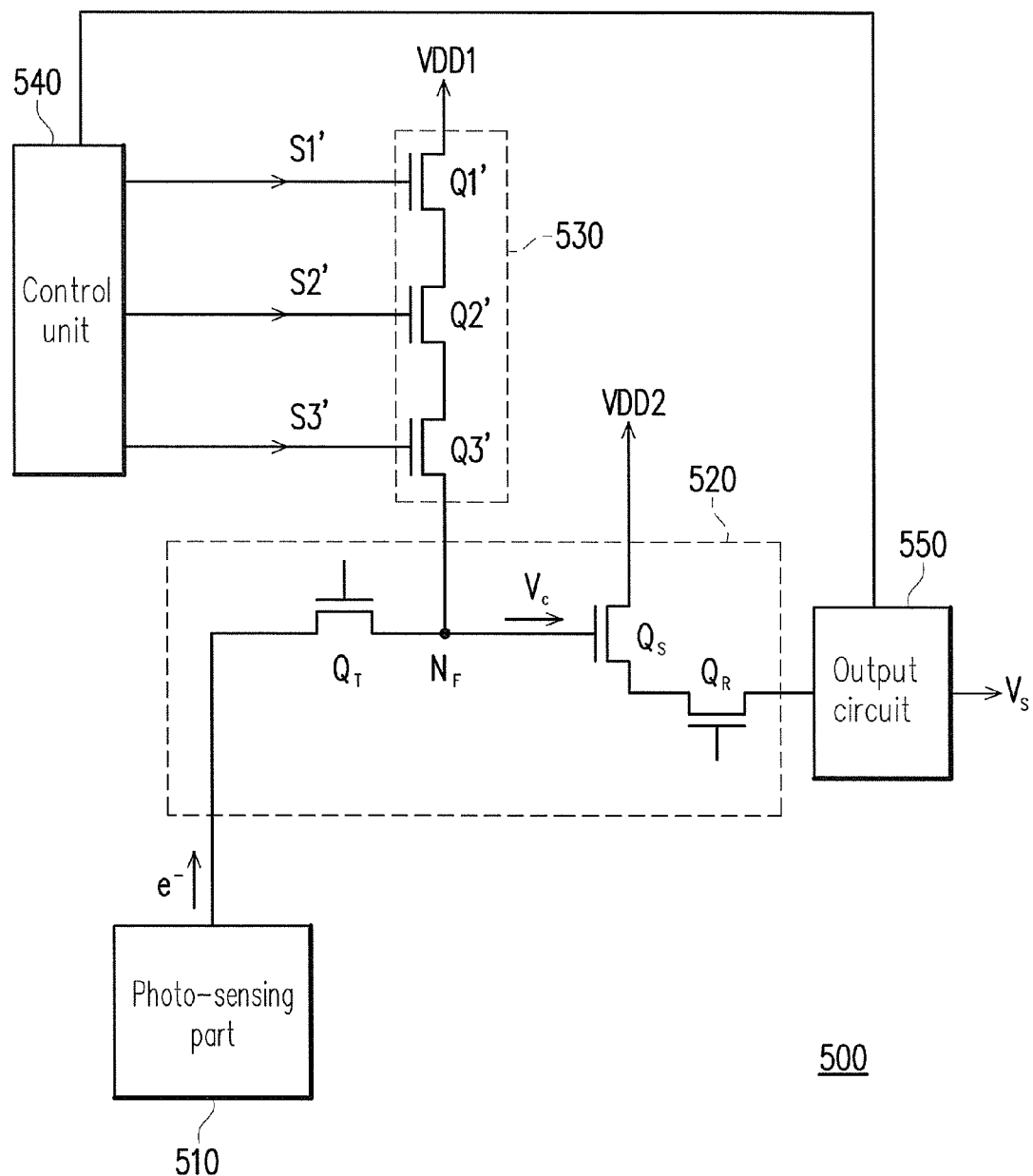
FIG. 5B is a diagram illustrating the internal circuit of each block of a photo-sensing pixel circuit according to another embodiment of the disclosure.

To be specific, the conversion gain adjustment unit 530 in the present embodiment includes three adjustment transistors Q1', Q2', and Q3' coupled between the power supply VDD1 and the floating node $N_F$ in series. The control unit 540 respectively control the on/off the adjustment transistors Q1', Q2', and Q3' by using control signals S1', S2', and S3', so as to adjust the equivalent capacitance C at the floating node $N_F$. On the other hand, FIG. 5B is a diagram illustrating the internal circuit of each block of the photo-sensing pixel circuit in FIG. 1 according to another embodiment of the disclosure, in which the row select transistor $Q_R$ transmits the voltage signal $V_C$ to the output circuit 550, and the output circuit 550 is coupled to the transfer transistor $Q_T$ via the source follower $Q_S$ and the row select transistor $Q_R$.

Figure 6A:
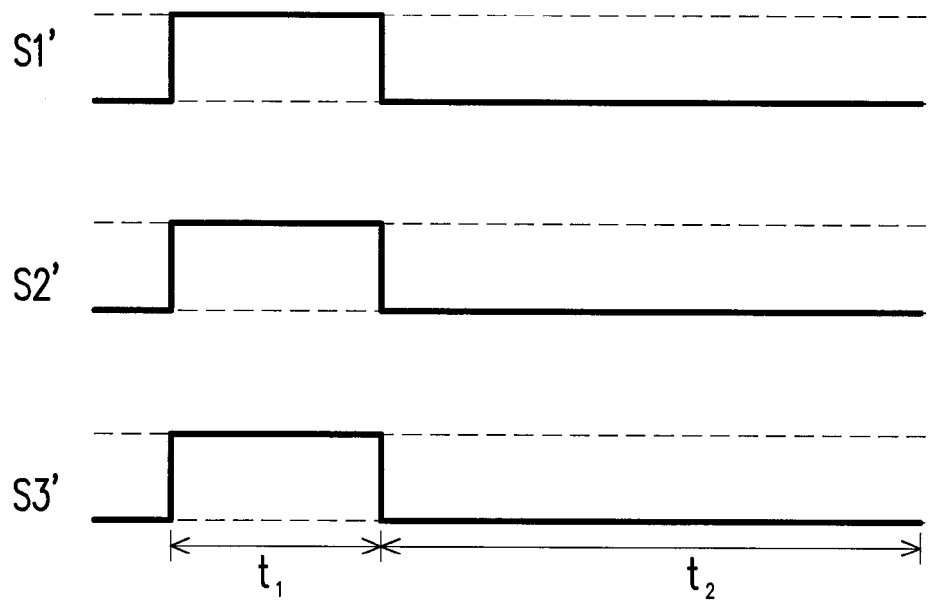
FIG. 6A, FIG. 7A, and FIG. 8A respectively illustrate waveforms of control signals S1', S2', and S3' of adjustment transistors when the photo-sensing pixel circuit in FIG. 5A operates in different operation modes.
Figure 6B:
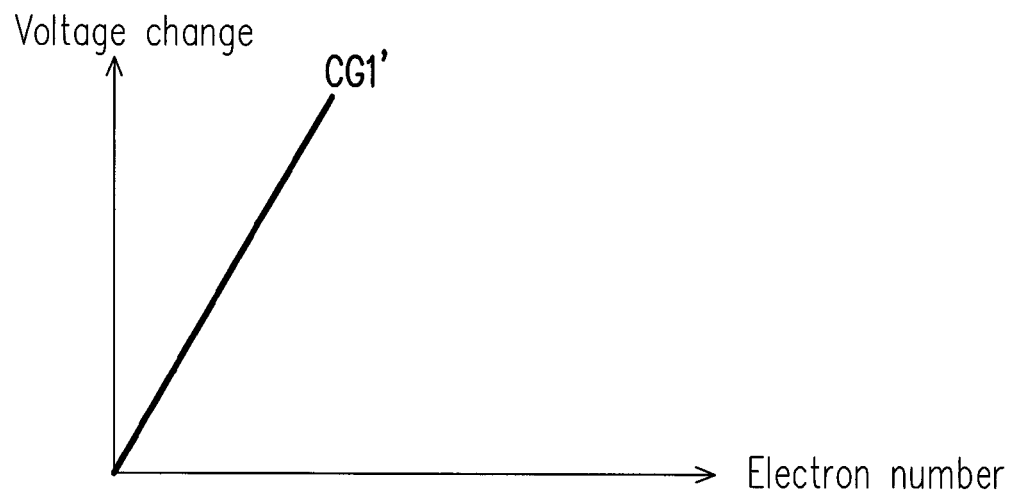
FIG. 6B, FIG. 7B, and FIG. 8B respectively illustrate a conversion gain of a signal conversion unit when the photo-sensing pixel circuit in FIG. 5A operates in different operation modes.
Figure 7A:
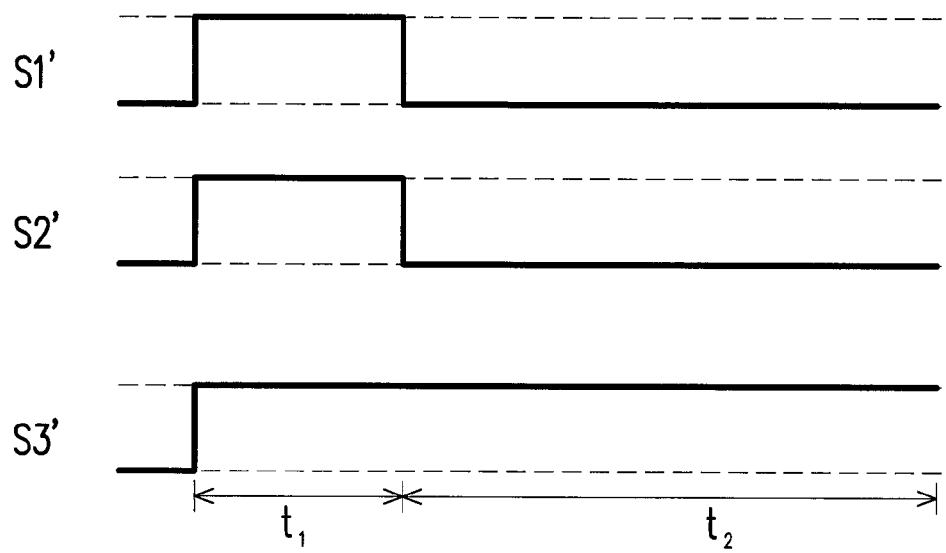
Figure 7B:
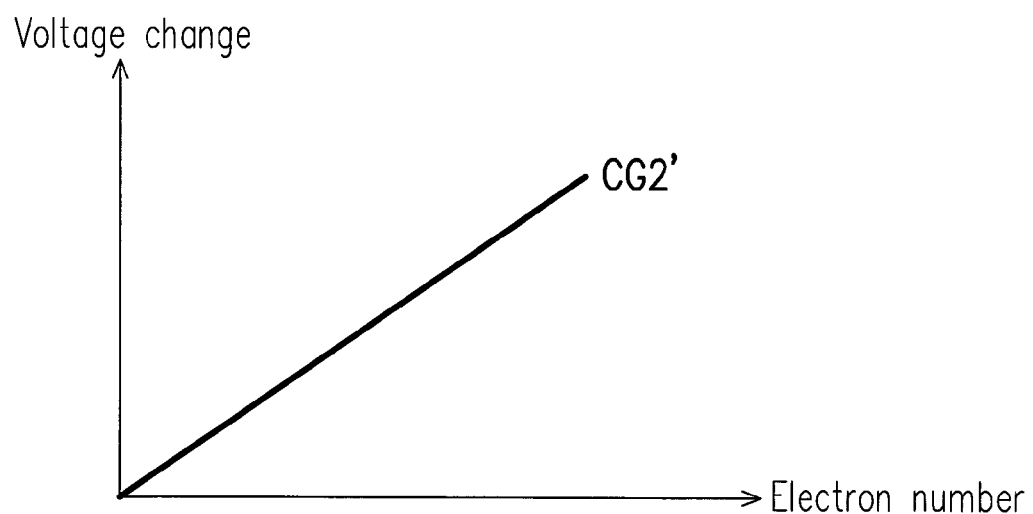
Figure 8A:
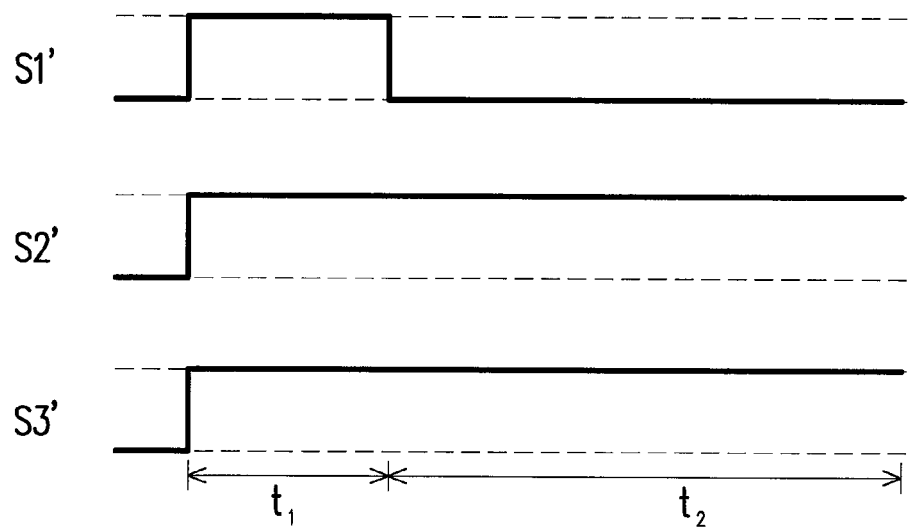
Figure 8B:
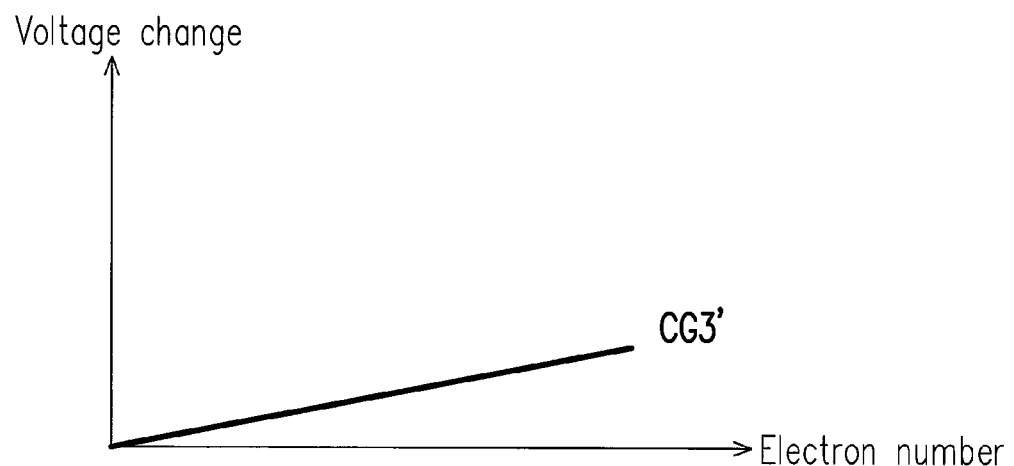

FIG. 6A, FIG. 7A, and FIG. 8A respectively illustrate waveforms of the control signals S1', S2', and S3' of the adjustment transistors when the photo-sensing pixel circuit in FIG. 5A operates in different operation modes. FIG. 6B, FIG. 7B, and FIG. 8B respectively illustrate the conversion gain of the signal conversion unit when the photo-sensing pixel circuit in FIG. 5A operates in different operation modes. Referring to FIG. 5A to FIG. 8B, in the present embodiment, regardless of operating in the first operation mode, the second operation mode, or the third operation mode, all the adjustment transistors are turned on during the period t1 because the control signals S1', S2', and S3' are at a high level. In this case, the power supply VDD1 resets the floating node $N_F$ of the signal conversion unit 520. Then, during the period t2 in the first operation mode, the second operation mode, and the third operation mode, the on/off states of the adjustment transistors Q1', Q2', and Q3' are respectively as follows. In the first operation mode, all the adjustment transistors Q1', Q2', and Q3' are turned off by the control signals S1', S2', and S3', as shown in FIG. 6A. In the second operation mode, the adjustment transistor Q3' is turned on by the control signal S3', the adjustment transistors Q2' and Q3' are turned off by the control signals S1' and S2', as shown in FIG. 7A. In the third operation mode, the adjustment transistors Q2' and Q3' are turned on by the control signals S2' and S3', and the adjustment transistor Q1' is turned off by the control signal S1', as shown in FIG. 8A.

According to the on/off states of the adjustment transistors Q1', Q2', and Q3' in the first, second, and third operation modes, the conversion gains of the signal conversion unit 520 in the first, second, and third operation modes satisfy CG1'>CG2'>CG3', wherein CG1' is the conversion gain of the signal conversion unit 520 in the first operation mode (as shown in FIG. 6B), CG2' is the conversion gain of the signal conversion unit 520 in the second operation mode (as shown in FIG. 7B), and CG3' is the conversion gain of the signal conversion unit 520 in the third operation mode (as shown in FIG. 8B). Namely, the more adjustment transistors are turned on, the smaller the conversion gain of the signal conversion unit 520 is.

In other words, in the photo-sensing pixel circuit 500 provided by the present embodiment, the conversion gain of the signal conversion unit 520 can be adaptively adjusted according to the brightness of the light source sensed by the photo-sensing pixel circuit 500. When the photo-sensing pixel circuit 500 detects high brightness, it can operate in a low-conversion-gain mode to increase the dynamic range. When the photo-sensing pixel circuit 500 detects low brightness, it can operate in a high-conversion-gain mode to achieve a high sensitivity and a high SNR.

It should be mentioned that the order of turning on the adjustment transistors Q1', Q2', and Q3' in different operation modes is not limited in exemplary embodiments of the disclosure. For example, it is within the scope of the disclosure as long as the adjustment transistors Q1', Q2', and Q3' are turned on during the period t1 in each operation mode so that the power supply VDD1 can reset the floating node $N_F$ of the signal conversion unit 520. Or, during the period t2 in each operation mode, when the output circuit 550 reads the voltage signal $V_C$ at the floating node $N_F$, the adjustment transistor Q1' is turned off so that the power supply VDD1 cannot reset the floating node $N_F$ of the signal conversion unit 520. In short, aforementioned on/off state combinations of the adjustment transistors are only some examples, and other state combinations can be adopted as along as the equivalent capacitance at the floating node can be changed.

Additionally, in an exemplary embodiment of the disclosure, each control unit turns on the adjustment transistors by using high-level control signals and turns off the adjustment transistors by using low-level control signals. However, the disclosure is not limited thereto, and in other embodiments, the level of the control signals for turning on/off the adjustment transistors can be adaptively adjusted according to the type of the adjustment transistors.

Moreover, in an exemplary embodiment of the disclosure, the adjustment transistors of the conversion gain adjustment unit are coupled with each other in series. However, the disclosure is not limited thereto, and in other embodiments, the circuit layout is within the scope of the disclosure as long as the equivalent capacitance at the floating node can be changed according to the brightness corresponding to the sensing signal output by the output circuit.

Figure 9:
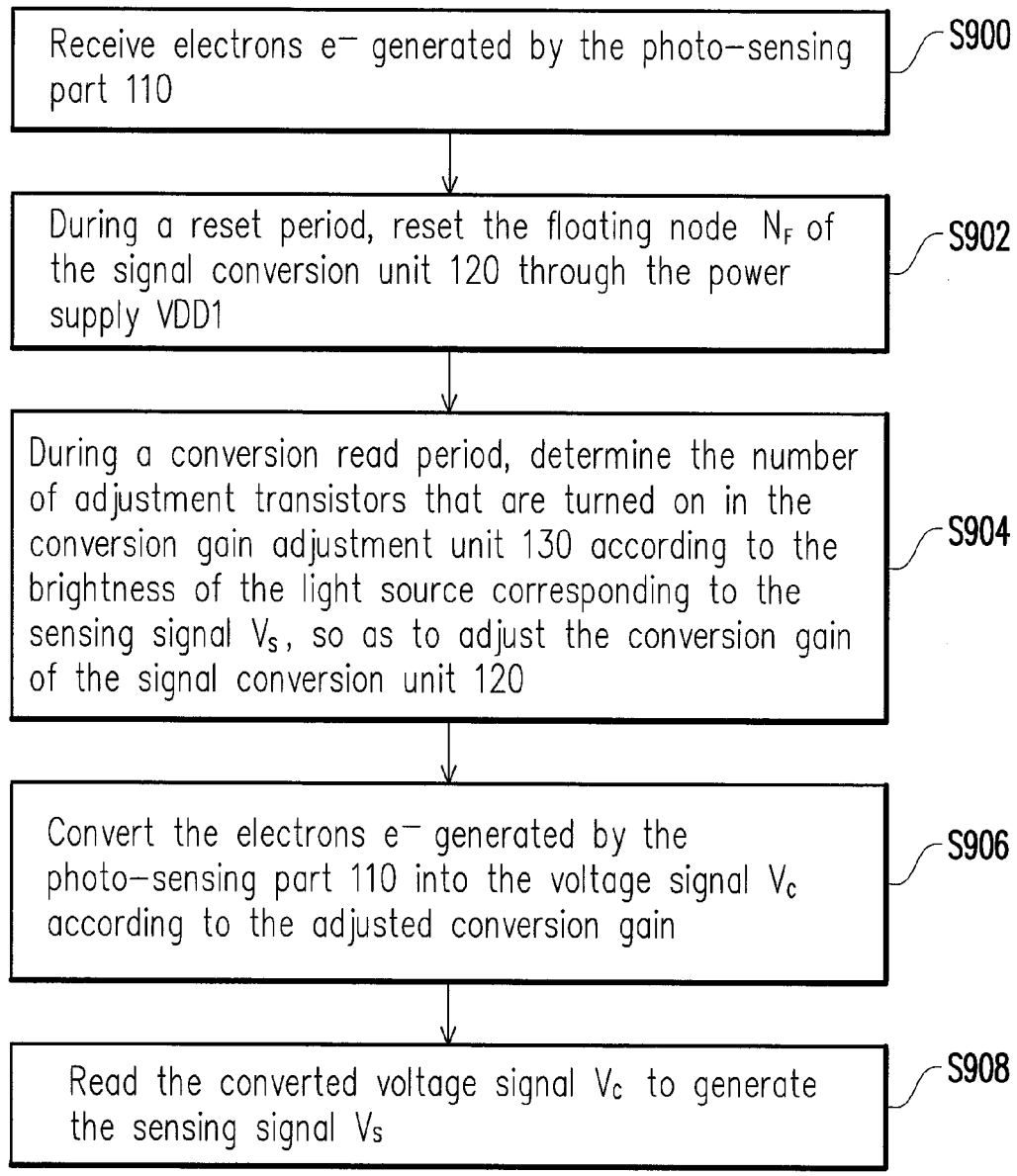
FIG. 9 is a flowchart of a method for adjusting a conversion gain according to an embodiment of the disclosure.

FIG. 9 is a flowchart of a method for adjusting a conversion gain according to an embodiment of the disclosure. Referring to both FIG. 2A and FIG. 9, the conversion gain adjustment method in the present embodiment is adapted to the photo-sensing pixel circuit in FIG. 2A and includes following steps. First, in step S900, electrons e- generated by the photo-sensing part 110 of the photo-sensing pixel circuit 100 are received. Then, in step S902, the floating node $N_F$ of the signal conversion unit 120 is reset through the power supply VDD1 during a reset period, wherein the reset period may be the period t1 in each operation mode. Next, in step S904, during a conversion read period, the number of adjustment transistors that are turned on in the conversion gain adjustment unit 130 is determined according to the brightness of the light source corresponding to the sensing signal $V_S$ output by the output circuit 150, so as to adjust the conversion gain of the signal conversion unit 120. Herein the value of the sensing signal $V_S$ output by the output circuit 150 represents the brightness of the light source, and the conversion read period may be the period t2 in each operation mode. In the present embodiment, the higher the brightness of the light source corresponding to the sensing signal $V_S$ output by the output circuit 150 is, the smaller the conversion gain is adjusted and the more adjustment transistors are turned on. Contrarily, the lower the brightness of the light source corresponding to the sensing signal $V_S$ output by the output circuit 150 is, the greater the conversion gain is adjusted and the fewer adjustment transistors are turned on. Thereafter, in step S906, the electrons e- generated by the photo-sensing part 110 are converted into the voltage signal $V_C$ according to the adjusted conversion gain. Next, in step S908, the converted voltage signal $V_C$ is read to generate the sensing signal $V_S$.

In addition, the conversion gain adjustment method in the present embodiment can be understood and implemented by referring to descriptions related to the embodiments illustrated in FIG. 1 to FIG. 8B and therefore will not be further described herein.

In summary, in an exemplary embodiment of the disclosure, a photo-sensing pixel circuit of an image sensor can adjust its conversion gain. When the photo-sensing pixel circuit detects higher brightness, it can operate in a low-conversion-gain mode to increase the dynamic range, and conversely, when the photo-sensing pixel circuit detects lower brightness, it can operate in a high-conversion-gain mode to offer both a high sensitivity and a high SNR. Thereby, the image sensor adopting the photo-sensing pixel circuit provided by the exemplary embodiments of the disclosure can offer both a high sensitivity and a large dynamic range.

It will be apparent to those skilled in the art that various modifications and variations can be made to the structure of the disclosure without departing from the scope or spirit of the disclosure. In view of the foregoing, it is intended that the disclosure cover modifications and variations of this invention provided they fall within the scope of the following claims and their equivalents.

What is claimed is:

1. A photo-sensing pixel circuit, comprising:
a photo-sensing part, sensing a light source, and generating a corresponding number of electrons;
a signal conversion unit, coupled to the photo-sensing part, having a floating node, and converting the electrons into a voltage signal according to a conversion gain, the signal conversion unit comprising:
a row select transistor, coupled to a source follower and an output circuit, and transmitting an amplified voltage signal to the output circuit, wherein the output circuit is coupled to a transfer transistor via the source follower and the row select transistor;
a conversion gain adjustment unit, coupled to the signal conversion unit via the floating node, and adjusting the conversion gain; and
the output circuit, coupled to the signal conversion unit, and outputting a sensing signal according to the voltage signal, wherein the sensing signal corresponds to the brightness of the light source,
wherein the conversion gain adjustment unit operates in at least two operation modes, and a conversion gain in one of the operation modes is greater than a conversion gain in the other operation mode,
wherein the conversion gain adjustment unit has a first end and a second end, the first end is coupled to a first power supply, and the second end is coupled to the floating node,
wherein the conversion gain adjustment unit comprises:
coupled between the first end and the second end, wherein the number of adjustment transistors is three or more, and wherein different numbers of the adjustment transistors are turned on in different ones of the operation modes, and the conversion gain of the signal conversion unit is adjusted according to the number of the adjustment transistors that are turned on,
wherein the photo-sensing pixel circuit further comprises:
a control unit, coupled to the output circuit, and adjusting the number of the adjustment transistors that are turned on according to the brightness of the light source corresponding to the sensing signal.

2. The photo-sensing pixel circuit according to claim 1, wherein the more adjustment transistors are turned on, the smaller the conversion gain of the signal conversion unit is.

3. The photo-sensing pixel circuit according to claim 1, wherein the first power supply resets the floating node when all of the adjustment transistors are turned on.

4. The photo-sensing pixel circuit according to claim 1, wherein the adjustment transistors are coupled between the first end and the second end in series.

5. The photo-sensing pixel circuit according to claim 1, wherein the signal conversion unit comprises:

the transfer transistor, coupled to the photo-sensing part, and transmitting the photocurrent signal to the floating node; and the source follower, coupled to the floating node and a second power supply, and amplifying the voltage signal.

6. The photo-sensing pixel circuit according to claim 1, wherein the higher the brightness of the light source corresponding to the sensing signal is, the smaller the conversion gain adjusted by the conversion gain adjustment unit is.

7. The photo-sensing pixel circuit according to claim 1, wherein the lower the brightness of the light source corresponding to the sensing signal is, the greater the conversion gain adjusted by the conversion gain adjustment unit is.

8. An image sensor, comprising a plurality of photo-sensing pixel circuits described in claim 1.

9. The photo-sensing pixel circuit according to claim 1, wherein the control unit directly controls the conversion gain adjustment unit to adjust the conversion gain.

10. A photo-sensing pixel circuit, comprising:
a photo-sensing part, sensing a light source, and generating a corresponding number of electrons;
a transfer transistor, coupled to the photo-sensing part, having a floating node, and converting the electrons generated by the photo-sensing part into a voltage signal;
a plurality of adjustment transistors, having a first end and a second end, wherein the first end is coupled to a first power supply, and the second end is coupled to the transfer transistor via the floating node;
an output circuit, coupled to the transfer transistor, and outputting a sensing signal according to the voltage signal, wherein the sensing signal corresponds to the brightness of the light source; and
a row select transistor, coupled to a source follower and the output circuit, and transmitting an amplified voltage signal to the output circuit, wherein the output circuit is coupled to the transfer transistor via the source follower and the row select transistor,
wherein the adjustment transistors operate in at least two operation modes, and in the different operation modes, a different number of the adjustment transistors are turned on,
coupled between the first end and the second end in series, and wherein the number of adjustment transistors is three or more,
wherein the photo-sensing pixel circuit further comprises:
a control unit, coupled to the output circuit, and adjusting the number of the adjustment transistors that are turned on according to the brightness of the light source corresponding to the sensing signal.

11. The photo-sensing pixel circuit according to claim 10, wherein the first power supply resets the floating node when all the adjustment transistors are turned on.

12. The photo-sensing pixel circuit according to claim 10, further comprising:
the source follower, coupled to the floating node, a second power supply, and the output circuit, and amplifying the voltage signal, wherein the output circuit is coupled to the transfer transistor via the source follower.

13. The photo-sensing pixel circuit according to claim 10, wherein the higher the brightness of the light source corresponding to the sensing signal is, the more adjustment transistors are turned on.

14. The photo-sensing pixel circuit according to claim 10, wherein the lower the brightness of the light source corresponding to the sensing signal is, the fewer adjustment transistors are turned on.

15. An image sensor, comprising a plurality of photo-sensing pixel circuits described in claim 10.

16. The photo-sensing pixel circuit according to claim 10, wherein the control unit directly controls the conversion gain adjustment unit to adjust the conversion gain.

* * * * *